(12) United States Patent
Kohda et al.

(10) Patent No.: US 9,401,402 B2
(45) Date of Patent: Jul. 26, 2016

(54) NITRIDE SEMICONDUCTOR DEVICE AND NITRIDE SEMICONDUCTOR SUBSTRATE

(71) Applicant: Panasonic Intellectual Property Management Co., Ltd., Osaka (JP)

(72) Inventors: Shinichi Kohda, Kyoto (JP); Masahiro Ishida, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/742,740

(22) Filed: Jun. 18, 2015

(65) Prior Publication Data
US 2015/0287791 A1    Oct. 8, 2015

Related U.S. Application Data

(63) Continuation of application No. PCT/JP2013/006448, filed on Oct. 31, 2013.

(30) Foreign Application Priority Data

Dec. 26, 2012 (JP) .................................. 2012-283632

(51) Int. Cl.
*H01L 29/04* (2006.01)
*H01L 29/20* (2006.01)
(Continued)

(52) U.S. Cl.
CPC ...... *H01L 29/2003* (2013.01); *H01L 21/02381* (2013.01); *H01L 21/02433* (2013.01); *H01L 21/02532* (2013.01); *H01L 21/02609* (2013.01); *H01L 29/045* (2013.01);
(Continued)

(58) Field of Classification Search
CPC .............. H01L 21/02027; H01L 21/02433; H01L 21/02516; H01L 21/02609; H01L 29/04; H01L 29/045
See application file for complete search history.

(56) References Cited

U.S. PATENT DOCUMENTS 8,193,020 B2 *  6/2012  Keller .................... C30B 25/02
                                                        257/E21.101
2006/0118819 A1  6/2006  Hanson et al.
(Continued)

FOREIGN PATENT DOCUMENTS

JP    2003-017419    1/2003
JP    2008-522447    6/2008
(Continued)

OTHER PUBLICATIONS

International Search Report of PCT application No. PCT/JP2013/006448 dated Feb. 4, 2014.
(Continued)

*Primary Examiner* — Jae Lee
(74) *Attorney, Agent, or Firm* — McDermott Will & Emery LLP

(57) ABSTRACT

An object of the present invention is to provide a nitride semiconductor device and a nitride semiconductor substrate in each of which a nitride semiconductor layer formed on a silicon substrate is improved in crystallinity to realize a decrease in on-resistance of a field-effect transistor. The nitride semiconductor device includes a silicon substrate, and a first nitride semiconductor layer formed over the silicon substrate and including a nitride semiconductor, wherein a Si <111> axial direction of the silicon substrate is different from a <0001> axial direction of the first nitride semiconductor layer.

16 Claims, 11 Drawing Sheets

(51) Int. Cl.
  *H01L 21/02* (2006.01)
  *H01L 29/10* (2006.01)
  *H01L 29/778* (2006.01)

(52) U.S. Cl.
  CPC ....... *H01L 29/1079* (2013.01); *H01L 29/7783* (2013.01); *H01L 29/7786* (2013.01)

(56) References Cited

U.S. PATENT DOCUMENTS

2008/0217625 A1* 9/2008 Kuroda ................. H01L 29/045
                                                              257/76
2011/0006397 A1   1/2011 Fujikura et al.
2012/0001194 A1   1/2012 Nakata et al.
2012/0217505 A1* 8/2012 Ando ................. H01L 29/7787
                                                              257/76

FOREIGN PATENT DOCUMENTS

| JP | 2009-038395 | 2/2009 |
| JP | 2011-016680 | 1/2011 |
| JP | 2012-015304 | 1/2012 |

OTHER PUBLICATIONS

Piao et al., "GaN growth on vicinal Si (111) substrates by MOCVD", Extended Abstracts, the 70th Meeting of the Japan Society of Applied Physics (Fall 2009, University of Toyama).

* cited by examiner

Inclined in Si (10-1) direction

Inclined in Si (−1-12) direction

Inclined in Si (10-1) direction

Inclined in Si (−1-12) direction

Inclined relative to Si (10-1) direction by four degrees

Rms=0.451nm

Threading dislocation

Inclined relative to Si (1-12) direction by one degree

NITRIDE SEMICONDUCTOR DEVICE AND NITRIDE SEMICONDUCTOR SUBSTRATE

TECHNICAL FIELD

The present invention relates to a nitride semiconductor device and a nitride semiconductor substrate, particularly, a nitride semiconductor device having a transistor structure, and a nitride semiconductor substrate.

BACKGROUND ART

Nitride semiconductors (Group III nitride semiconductors) containing, as a main component, gallium nitride (GaN), aluminum nitride (AlN) or indium nitride (InN), or a mixed crystal of these compounds, are wide band gap semiconductors, and are large in dielectric breakdown field. Moreover, the semiconductors are larger in electron saturated drift velocity than silicon-based semiconductors or gallium arsenic (GaAs)-based compound semiconductors. Thus, the nitride semiconductors can gain a high electron mobility and be further heightened in withstand voltage. Furthermore, between a hetero-interface between aluminum gallium nitride (AlGaN) having, as a main surface thereof, a surface having a (0001) plane direction, and gallium nitride (GaN) or the like, electric charges are generated by spontaneous polarization or piezoelectric polarization. The sheet carrier concentration in the hetero-interface becomes $1\times10^{13}$ $cm^{-2}$ or more by these polarization effects even when this semiconductor is not particularly doped. It is therefore possible to make use of a two-dimensional electron gas (2DEG) in the hetero-interface to realize a hetero-junction field effect transistor (HFET) which is high in current density.

At present, as a substrate on which crystals of such a nitride semiconductor are to be grown, there is used not a substrate made of a nitride semiconductor same as the crystal growing material, but a sapphire substrate, a silicon carbide substrate, a silicon substrate, or any other substrate made of a material different in kind from the crystal growing material and having a large lattice mismatch with nitride semiconductors. This is because even when a substrate made of a nitride semiconductor is produced, it is necessary to form, by a vapor growth method, the nitride semiconductor on a substrate made of a material different in kind from the nitride semiconductor to be grown. In other words, in order to grow a nitride semiconductor on a substrate of a nitride semiconductor same in kind to the crystal growing material to produce a substrate made of the nitride semiconductor, costs are high in the present circumstances and further a substrate having a large diameter is not obtained. By contrast, according to silicon substrates, substrates having a large diameter can be mass-produced, so that the silicon substrates are superior also from the viewpoint of costs.

However, when a nitride semiconductor is formed on a silicon substrate, the following drawbacks are caused.

First, the nitride semiconductor is larger in thermal expansion coefficient than silicon, and a difference therebetween is also large. Moreover, crystal growth of the nitride semiconductor is generally conducted at a high temperature of about 1000° C.; thus, when a film of the nitride semiconductor is formed on the silicon substrate at a high temperature and subsequently the temperature of the substrate is lowered to room temperature, tensile stress is easily generated in the nitride semiconductor by a difference in thermal expansion coefficient between the nitride semiconductor and the silicon substrate. Accordingly, there arises a problem that highly-dense defects, or cracks are generated in the nitride semiconductor formed on the silicon substrate.

Second, when a nitride semiconductor containing gallium (Ga) is formed, a raw material therefor is easily combined with silicon to produce a compound. Accordingly, there also arises a problem that when a nitride semiconductor containing gallium (Ga) is formed on a silicon substrate, the nitride semiconductor hardly grows flatly on the silicon substrate.

Third, a nitride semiconductor grown on a substrate different in kind from the nitride semiconductor which is a crystal growing material, such as a silicon substrate, has a problem of being affected by lattice mismatch with the substrate, so as to become very high in dislocation density.

In order to restrain such problems of silicon substrates, various methods have been investigated as a method for forming a film of a nitride semiconductor on a silicon substrate. For example, investigations have been made about the formation of an aluminum oxide layer on a silicon substrate by sputtering, followed by the formation of an aluminum nitride layer on the aluminum oxide layer (see, for example, PTL 1).

Moreover, investigations have been made about the formation of a nitride semiconductor by nitriding silicon on a silicon substrate to produce silicon nitride, and then forming aluminum nitride on the silicon nitride (see, for example, PTL 2).

Furthermore, investigations have been made about an improvement of the crystallinity of aluminum nitride by forming aluminum nitride on a silicon substrate having a main surface having an inclination angle of 0.1° or less to a (111) plane of the silicon substrate (see, for example, PTL 3).

CITATION LIST

Patent Literatures

PTL 1: Unexamined Japanese Patent Publication No. 2009-038395

PLT 2: Japanese Translation of PCT Publication No. 2008-522447

PLT 3: Unexamined Japanese Patent Publication No. 2012-15304

SUMMARY OF THE INVENTION

However, when a conventional technique is used to form a nitride semiconductor layer on a silicon substrate, this layer may not be good in crystallinity since the silicon substrate and the nitride semiconductor have a large lattice mismatch therebetween, so that many threading dislocations are produced in the nitride semiconductor layer. As a result, when devices such as field effect transistors are formed on the nitride semiconductor formed on the silicon substrate, a problem is caused that electrons therein are lowered in mobility so that on-resistance of the devices is raised.rrrrr In light of the problems, an object of the present invention is to provide a nitride semiconductor device and a nitride semiconductor substrate in each of which a nitride semiconductor formed on a silicon substrate is improved in crystallinity to realize a decrease in on-resistance of a field-effect transistor.

In order to attain the object, a nitride semiconductor device according to an aspect of the present invention includes a silicon substrate, and a first nitride semiconductor layer formed over the silicon substrate and including a nitride semiconductor. A Si <111> axial direction of the silicon substrate is different from a <0001> axial direction of the first nitride semiconductor layer.

According to this structure, the silicon substrate is made different in crystal axial direction from the nitride semiconductor layer formed over the silicon substrate to make it possible to improve the nitride semiconductor layer formed over the silicon substrate in crystallinity to realize a decrease in on-resistance of a field effect transistor.

It is also desired that an angle between a normal line vector direction of a main surface of the first nitride semiconductor layer and the <0001> axial direction of the first nitride semiconductor layer is smaller than an angle between a normal line vector direction of a main surface of the silicon substrate and the Si <111> axial direction of the silicon substrate.

When the nitride semiconductor layer is formed to make the Si <111> axial direction of the silicon substrate parallel to the <0001> axial direction of the nitride semiconductor layer, many defects are generated since a difference in lattice constant between silicon and the nitride semiconductor is large. By forming the first nitride semiconductor layer as described above to deviate crystal axes of the silicon substrate from crystal axes of the first nitride semiconductor layer, lattice mismatch between the substrate and the nitride semiconductor is relieved so that the nitride semiconductor layer can be improved in crystallinity.

It is also desired that the nitride semiconductor device includes a second nitride semiconductor layer over the first nitride semiconductor layer, and the <0001> axial direction of the first nitride semiconductor layer is equal to a <0001> axial direction of the second nitride semiconductor layer.

By forming the second nitride semiconductor layer in this way to assume a crystal structure of the first nitride semiconductor layer which is improved in crystallinity, the second nitride semiconductor layer can be improved in crystallinity.

It is also desired that the nitride semiconductor device includes a third nitride semiconductor layer over the second nitride semiconductor layer, and the third nitride semiconductor layer is larger in average band gap than the second nitride semiconductor layer.

By laying the third nitride semiconductor layer larger in band gap over the second nitride semiconductor layer in this way, a two-dimensional electron gas (2DEG) can be produced in an interface between the second and third nitride semiconductor layers.

It is also desired that the nitride semiconductor device includes a first electrode and a second electrode over the third nitride semiconductor layer, and longitudinal directions of the first electrode and the second electrode are parallel to a <11-20> axial direction of the second nitride semiconductor layer.

By forming the first and second electrodes in this way to be parallel to the <11-20> axis of the second nitride semiconductor layer, electrons therein are improved in mobility so that the nitride semiconductor device can be decreased in on-resistance.

It is also desired that first electrode and second electrode are formed over the third nitride semiconductor layer, and longitudinal directions of the first electrode and the second electrode are parallel to a <1-100> axis of the second nitride semiconductor layer.

By forming the first and second electrodes in this way to be parallel to the <1-100> axis of the second nitride semiconductor layer, electrons therein are improved in mobility so that the nitride semiconductor device can be decreased in on-resistance.

It is also desired that the first nitride semiconductor layer includes aluminum.

When the first nitride semiconductor layer includes aluminum in this way, the first nitride semiconductor layer can be improved in quality.

It is also desired that the normal line vector direction of the main surface of the silicon substrate is inclined relative to the Si <111> axial direction at an angle larger than 0° and smaller than 2.0°.

When the main surface of the silicon substrate is inclined relative to the Si <111> axis at an angle ranging from 0° to 2.0° in this way, the nitride semiconductor layer can be improved in crystallinty.

It is also desired that the nitride semiconductor device includes a fourth nitride semiconductor layer between the first nitride semiconductor layer and the second nitride semiconductor layer, and an inside of the fourth nitride semiconductor layer is larger in average band gap than the second nitride semiconductor layer.

By laying the fourth nitride semiconductor layer which is larger in band gap than the second nitride semiconductor layer in this way, stress remaining in the substrate can be relieved, and further the nitride semiconductor device can be improved in withstand voltage.

A nitride semiconductor substrate according to another aspect of the present invention includes a silicon substrate, and a first nitride semiconductor layer formed over the silicon substrate and including a nitride semiconductor. A Si <111> axial direction of the silicon substrate is different from a <0001> axial direction of the first nitride semiconductor layer.

It is desired that an angle between a normal line vector direction of a main surface of the first nitride semiconductor layer and the <0001> axial direction of the first nitride semiconductor layer is smaller than an angle between a normal line vector direction of a main surface of the silicon substrate and the Si <111> axial direction.

By forming the first nitride semiconductor layer in this way to deviate crystal axes of the silicon substrate from crystal axes of the first nitride semiconductor layer, lattice mismatch between the substrate and the nitride semiconductor is relieved so that the nitride semiconductor layer can be improved in crystallinity.

It is also desired that the nitride semiconductor substrate includes a second nitride semiconductor layer over the first nitride semiconductor layer, and the <0001> axial direction of the first nitride semiconductor layer is equal to a <0001> axial direction of the second nitride semiconductor layer.

By forming the second nitride semiconductor layer in this way to assume a crystal structure of the first nitride semiconductor layer which is improved in crystallinity, the second nitride semiconductor layer can be improved in crystallinity.

It is also desired that the nitride semiconductor substrate includes a third nitride semiconductor layer over the second nitride semiconductor layer, and the third nitride semiconductor layer is larger in average band gap than the second nitride semiconductor layer.

By laying the third nitride semiconductor layer larger in band gap over the second nitride semiconductor layer in this way, a two-dimensional electron gas (2DEG) can be produced in an interface between the second and third nitride semiconductor layers.

It is also desired that the first nitride semiconductor layer includes aluminum.

When the first nitride semiconductor layer includes aluminum in this way, the first nitride semiconductor layer can be improved in quality.

It is also desired that the normal line vector direction of the main surface of the silicon substrate is inclined relative to the Si <111> axial direction at an angle larger than 0° and smaller than 2.0°. When the main surface of the silicon substrate is inclined relative to the Si <111> axis at an angle ranging from 0° to 2.0°, the nitride semiconductor layer can be improved in crystallinity.

It is also desired that the nitride semiconductor substrate includes a fourth nitride semiconductor layer between the first nitride semiconductor layer and the second nitride semiconductor layer, and the fourth nitride semiconductor layer is larger in average band gap than the second nitride semiconductor layer.

By laying the fourth nitride semiconductor layer which is larger in band gap than the second nitride semiconductor layer in this way, stress remaining in the substrate can be relieved, and further the nitride semiconductor layers can be improved in withstand voltage.

The semiconductor device according to the present invention makes it possible to provide a nitride semiconductor device and a nitride semiconductor substrate in each of which a nitride semiconductor layer formed over a silicon substrate is improved in crystallinity to realize a decrease in on-resistance of a field-effect transistor.

DESCRIPTION OF EMBODIMENTS

First Exemplary Embodiment

Figure 1:
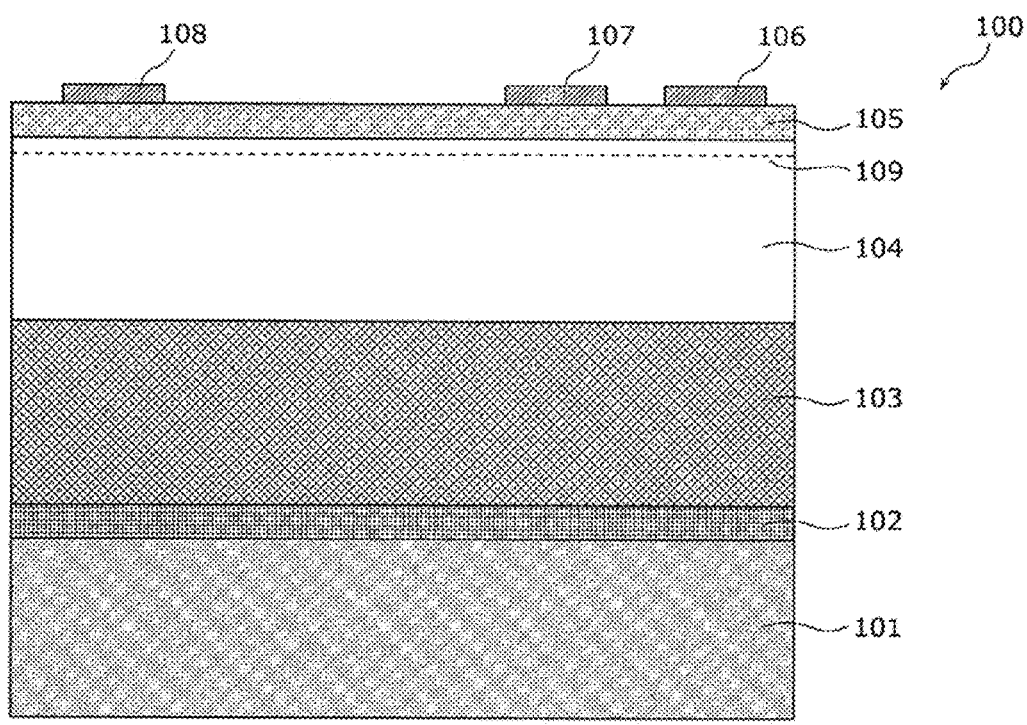
FIG. 1 is a schematic sectional view illustrating a nitride semiconductor device according to a first exemplary embodiment.

With reference to FIG. 1, a description will be made about nitride semiconductor device 100 according to a first exemplary embodiment of the present invention. FIG. 1 is a sectional view illustrating a structure of nitride semiconductor device 100 according to the first exemplary embodiment of the present invention.

Nitride semiconductor device 100, which is a hetero-junction field effect transistor (HFET), has silicon substrate 101 having a main surface inclined slightly from a Si (111) plane of silicon substrate 101, first nitride semiconductor layer 102 formed on silicon substrate 101 and made of aluminum nitride, fourth nitride semiconductor layer 103 formed on first nitride semiconductor layer 102 and made of AlGaN, second nitride semiconductor layer 104 formed on fourth nitride semiconductor layer 103 and made of GaN, and third nitride semiconductor layer 105 formed on second nitride semiconductor layer 104 and made of AlGaN. Source electrode 106, gate electrode 107 and drain electrode 108 are formed on third nitride semiconductor layer 105. Source electrode 106, gate electrode 107 and drain electrode 108 correspond to a first electrode, a third electrode and a second electrode in the present invention, respectively.

It is sufficient for first nitride semiconductor layer 102 formed on the main surface of silicon substrate 101 to be formed using a nitride semiconductor capable of assuming crystal information of silicon substrate 101. This layer may be, for example, a nitride semiconductor layer made of aluminum nitride and having a mono-layered structure or multi-layered structure.

Fourth nitride semiconductor layer 103 has, as a buffer layer, an advantageous effect of relieving stress existing inside each of the nitride semiconductor layers on silicon substrate 101. It is desired that fourth nitride semiconductor layer 103 as the buffer layer is, for example, a nitride semiconductor layer made of AlGaN and having a mono-layered structure, more preferably a nitride semiconductor layer having a multi-layered structure for relieving the stress; and it is desired that this layer is larger in average band gap than second nitride semiconductor layer 104.

The multi-layered structure for relieving the stress has, for example, a superlattice structure composed of plural AlGaN layers different in composition from one another. By the superlattice structure, the stress is relieved so that warps generated in the nitride semiconductor layers can be decreased. Moreover, when the superlattice structure or multi-layered structure contains therein a layer small in band gap, a two-dimensional electron gas (2DEG) comes to be easily generated in the layer small in band gap by spontaneous polarization or piezoelectric polarization. When the 2DEG is generated in this way, a leakage current is generated inside the second nitride semiconductor layer so that the device is remarkably lowered in withstand voltage. In the superlattice structure, therefore, it is necessary to raise the resistance value of the layer small in band gap not to generate any 2DEG. The resistance value can be raised, for example, by heightening the carbon concentration of the layer small in band gap. Specifically, the layer small in band gap may be doped with carbon.

Second nitride semiconductor layer 104 is made of $In_xAl_yGa_{1-x-y}N$ wherein $0 \leq x < 1$, $0 \leq y < 1$ and $0 \leq x+y < 1$, and is made of, for example, GaN, which is represented by $In_xAl_yGa_{1-x-y}N$ wherein $x=0$ and $y=0$.

Third nitride semiconductor layer 105 is made of $In_xAl_yGa_{1-x-y}N$ wherein $0 \leq x < 1$, $0 < y < 1$ and $0 < x+y \leq 1$, and is made of, for example, $Al_{0.2}Ga_{0.8}N$, which is represented by $In_xAl_yGa_{1-x-y}N$ wherein $x=0$ and $y=0.2$. Second nitride semiconductor layer 104 is a semiconductor smaller in average band gap than third nitride semiconductor layer 105. In an interface between second nitride semiconductor layer 104 and third nitride semiconductor layer 105, two-dimensional electron gas (2DEG) 109 is produced by spontaneous polarization and piezoelectric polarization.

In order to heighten electron mobility of second nitride semiconductor layer 104, it is desired that this layer is doped in a low level. When carriers are present in the layer, the mobility thereof is heightened by heightening a voltage applied to the device; thus, second nitride semiconductor layer 104 acts as a layer low in resistance.

Hereinafter, a description will be made about a method for producing the hetero-junction field effect transistor (HFET) having the nitride semiconductors according to the first exemplary embodiment configured as described above.

Initially, a crystal growing apparatus is used to form the following layers successively on silicon substrate 101 inclined slightly from a Si (111) plane of the substrate: first nitride semiconductor layer 102, fourth nitride semiconductor layer 103, second nitride semiconductor layer 104, and third nitride semiconductor layer 105, each of these layers being made of a nitride semiconductor.

Specifically, a main surface of silicon substrate 101 is first washed with buffered hydrofluoric acid to remove a native oxide film on the main surface. Thereafter, silicon substrate 101 is put into a crystal growing apparatus. The crystal growing apparatus is desirably an apparatus capable of growing a high-quality nitride semiconductor. The following methods are usable: a molecular beam epitaxy (MBE) method; a metal-organic vapor phase epitaxy (MOVPE) or metal-organic chemical vapor deposition (MOCVD) method; a hydride vapor phase epitaxy (HVPE) method; and other methods. Herein, the production method is described giving the MOCVD method as an example.

Subsequently, the crystal growing apparatus is used to form first nitride semiconductor layer 102. It is sufficient for first nitride semiconductor layer 102 to be a nitride semiconductor made of $Al_xGa_{1-x}N$ wherein $0 \leq x \leq 1$. In the first exemplary embodiment, the material which constitutes first nitride semiconductor layer 102 is aluminum nitride (AlN). In order to dope first nitride semiconductor layer 102 with carbon to have a high carbon-concentration, adopted is a method of taking in carbon from trimethylaluminum (TMA) which is a source for supplying Al atoms at a temperature of 900° C. Besides this method, a method may be adopted in which first nitride semiconductor layer 102 is actively doped with carbon using a carbon supply source such as carbon tetrabromide ($CBr_4$), ethane ($C_2H_6$) or methane ($CH_4$).

In the case of the doping with carbon by the use of the carbon supply source, the growth temperature can be kept at a higher level of about 1100° C. in the case of the same doping without using any carbon supply source. The carbon concentration in the resultant crystals can be heightened also by adjusting the V/III ratio of Group-V-raw-material (nitrogen) to Group-III-raw-material to a low value when the crystal grows.

Hereinafter, a description will be made about a case of using trimethylaluminum (TMA) as a source for supplying Al atoms and C atoms in first nitride semiconductor layer 102. As described below, first nitride semiconductor layer 102 is composed of a first aluminum nitride layer and a second aluminum nitride layer different in carbon concentration from each other.

Silicon substrate 101, the outer surface of which has been washed, is charged into a crystal growing apparatus, and then the outer surface of silicon substrate 101 is subjected to high-temperature thermal cleaning with an atmosphere of ammonia ($NH_3$), or hydrogen ($H_2$) or nitrogen ($N_2$) containing no organometallic compound.

Subsequently, the temperature is lowered to 900° C., and trimethylaluminum (TMA) and ammonia gas are supplied to the system to form the first aluminum nitride layer high in carbon concentration thereon. After the formation of the first aluminum nitride layer to have a predetermined thickness, the growth temperature is raised to 1100° C.

Similarly, TMA and ammonia gas are supplied to the system to form the second aluminum nitride layer low in carbon concentration thereon this time. In this way, first nitride semiconductor layer 102, which has a multi-layered structure, is formed.

Next, the temperature is lowered to about 1000° C. to form, as fourth nitride semiconductor layer 103, an $Al_{0.5}Ga_{0.5}N$ layer high in carbon concentration to have a thickness of, e.g., 0.1 μm. Since the growth temperature is lowered to about 1000° C. at this time, the concentration of carbon, with which the $Al_{0.5}Ga_{0.5}N$ layer is doped, can be raised. By raising the concentration of carbon, the $Al_{0.5}Ga_{0.5}N$ layer can be heightened in resistance so that the resultant HFET can be heightened in withstand voltage.

Subsequently, an undoped GaN layer is formed, as second nitride semiconductor layer 104, to have a thickness of 500 nm on fourth nitride semiconductor layer 103 at a temperature of about 1100° C.

Subsequently, an undoped $Al_{0.2}Ga_{0.8}N$ layer is formed, as third nitride semiconductor layer 105, to have a thickness of about 50 nm on second nitride semiconductor layer 104 at a temperature of about 1100° C.

After the above-mentioned individual nitride semiconductor layers are continuously grown, silicon substrate 101 is taken out from the crystal growing apparatus.

Next, a lithographic method using patterning is used to form, thereon, a first resist film having openings in its resist-portions above a region where source electrode 106 is to be formed and above a region where drain electrode 108 is to be formed. Thereafter, a vapor deposition apparatus is used to form an ohmic-electrode-forming metal film for constituting source electrode 106 and drain electrode 108 on the first resist film (not illustrated) and on third nitride semiconductor layer 105 exposed from the first resist film. Thereafter, a lift-off method is used to remove the first resist film, and unnecessary portions of the ohmic-electrode-forming metal film that are present on the first resist film, that is, portions other than the portions that are to be source electrode 106 and drain electrode 108. In this way, source electrode 106 and drain electrode 108 are formed. Respective longitudinal directions of source electrode 106 and drain electrode 108 are parallel to, for example, a <11-20> axial direction of second nitride semiconductor layer 104. The respective longitudinal directions of source electrode 106 and drain electrode 108 may be parallel to a <1-100> axial direction of second nitride semiconductor layer 104.

Next, a lithographic method using patterning is used to form, thereon, a second resist film (not illustrated) having an opening above a region where gate electrode 107 is to be formed. Thereafter, a vapor deposition apparatus is used to form a Schottky-electrode-forming metal film for constituting gate electrode 107 on the second resist film, and third nitride semiconductor layer 105 exposed from the second resist film. Thereafter, a lift-off method is used to remove the second resist film, and unnecessary portions of the Schottky-electrode-forming metal film that are present on the second resist film, that is, portions other than a portion that is to be gate electrode 107. In this way, gate electrode 107 is formed.

By this production method, hetero-junction field effect transistor (HFET) 100 can be formed, which has been described in the first exemplary embodiment.

A nitride semiconductor device 100 sample having the structure in FIG. 1 has been formed on silicon substrate 101 having a main surface inclined from a Si (111) plane of the silicon substrate in a Si (10-1) direction thereof by each of 0°, 0.5°, 1.0°, 2.0°, and 4.0°, and the same nitride semiconductor device has been formed on silicon substrate 101 having a main surface inclined from a Si (111) plane of the silicon substrate in a Si (1-12) direction thereof by each of 0°, 0.5°, 1.0°, 2.0°, 4.0°, and 7.0°.

Figure 2A:
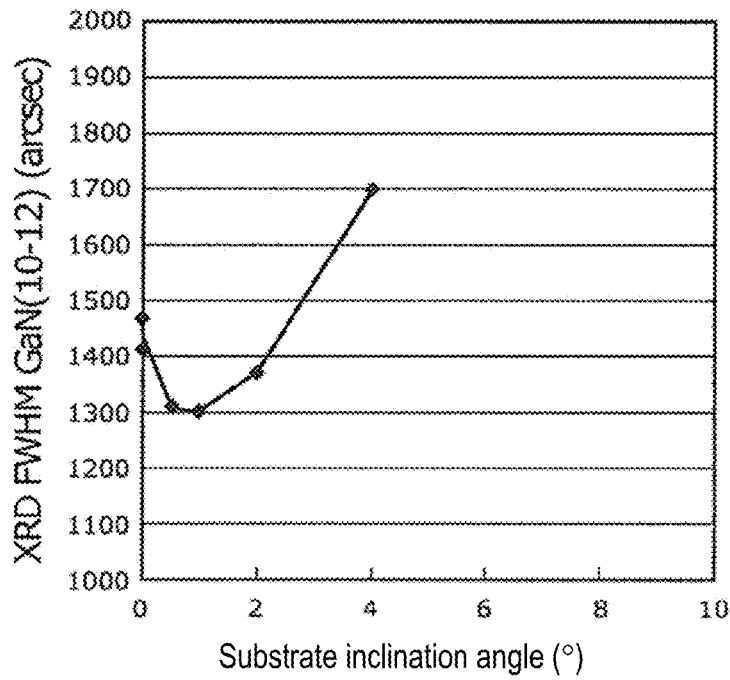
FIG. 2A is a graph showing the crystallinity of a gallium nitride layer formed on a silicon substrate having a main surface inclined in a Si (10-1) direction of the substrate from a Si (111) plane of the substrate.
Figure 2B:
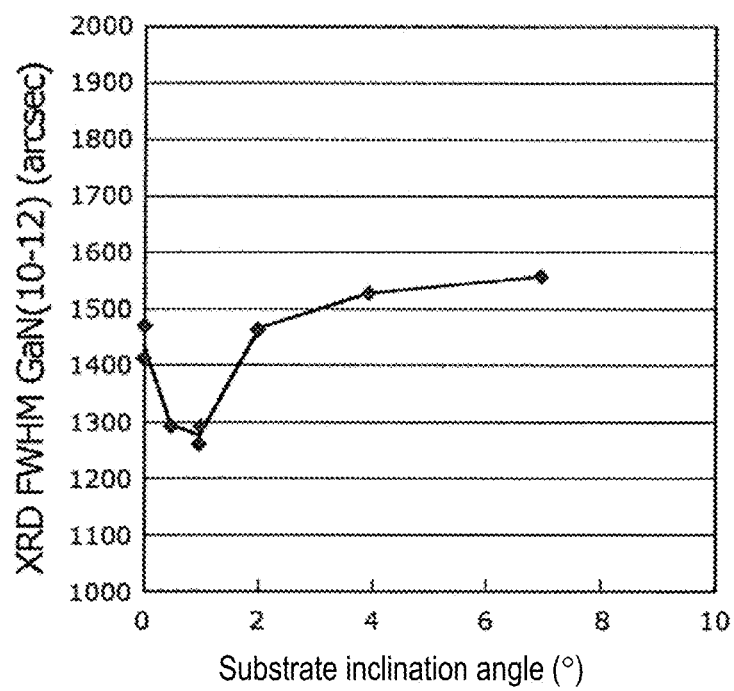
FIG. 2B is a graph showing the crystallinity of a gallium nitride layer formed on a silicon substrate having a main surface inclined in a Si (1-12) direction of the substrate from a Si (111) plane of the substrate.

FIG. 2A as well as FIG. 2B shows a full width half maximum of a rocking curve of GaN (10-12) of each of the samples according to XRD. FIG. 2A as well as FIG. 2B demonstrates that as the GaN (10-12) rocking curve value represented by its vertical axis is smaller, a crystal orientation of the GaN (10-12) less makes its appearance so that a crystal orientation of the Si (10-1) more largely makes its appearance. In other words, it is demonstrated that: as the GaN (10-12) rocking curve value is smaller, the crystallinity is better; and as the rocking curve value is larger, the crystallinity is worse.

According to FIG. 2A, in the Si (10-1) direction, the rocking curve value is small in a range of slight inclination angles more than 0° and about 2° or less. It is therefore understood that any one of the nitride semiconductor device 100 samples each formed on silicon substrate 101 inclined in the Si (10-1) direction is better in crystallinity than the nitride semiconductor device sample formed on silicon substrate 101 uninclined, which is a just substrate (the inclination angle thereof is 0°). Similarly, according to FIG. 2B, in the Si (-1-12) direction, the rocking curve value is small in a range of angles more than 0° and about 2° or less. It is therefore understood that any one of the nitride semiconductor device 100 samples each formed on silicon substrate 101 inclined in the Si (-1-12) direction is better in crystallinity than the nitride semiconductor device 100 sample formed on uninclined silicon substrate 101. By contrast, any one of the nitride semiconductor device samples each formed on the silicon substrate the inclination angle of which is larger than 2° is larger in rocking curve value than the nitride semiconductor device sample formed on the just substrate (the inclination angle thereof is 0°). It is therefore understood that the inclined substrates are poorer in crystallinity than the just substrate.

Herein, a description is made about reasons why an improvement is made in the crystallinity of the nitride semiconductor device samples each formed on the silicon substrate inclined in the Si (10-1) direction or the Si (-1-12) direction, as described above.

Figure 3A:
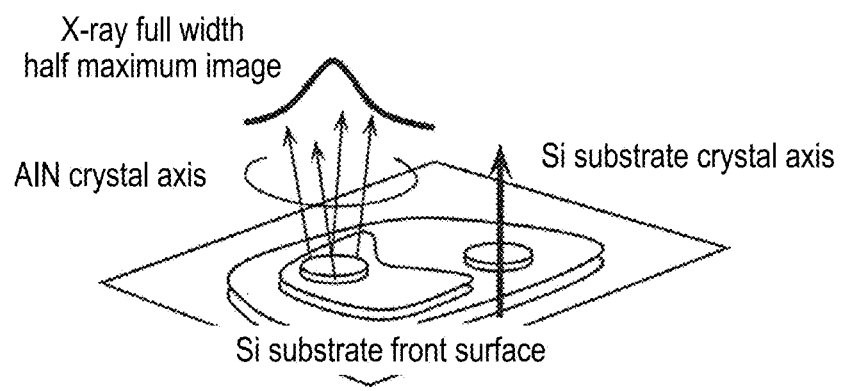
FIG. 3A is a schematic view for describing a relationship between the inclination angle of a main surface of a silicon substrate and the crystallinity of the silicon substrate when crystal axes of AlN are inconsistent with one another.
Figure 3B:
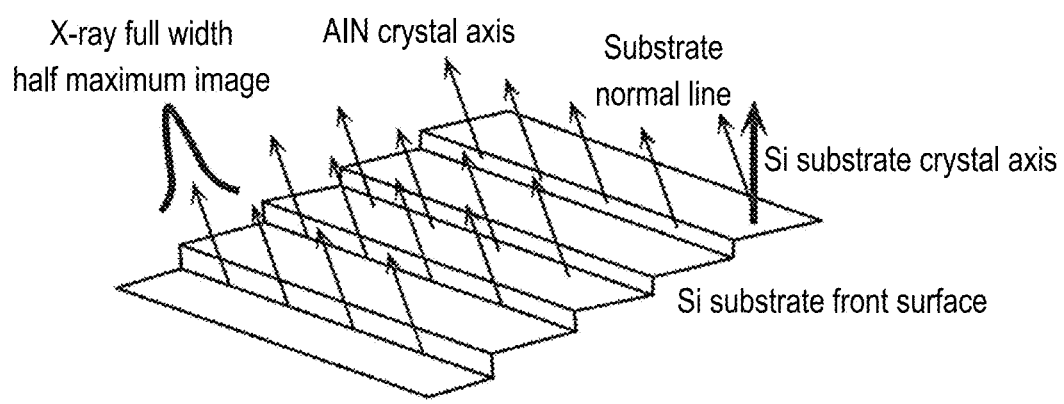
FIG. 3B is a schematic view for describing a relationship between the inclination angle of a main surface of a silicon substrate and the crystallinity of the silicon substrate when crystal axes of AlN are consistent with one another.

FIG. 3A is a schematic view for describing the following in the case of a just substrate that is a silicon substrate having a main surface having an inclination angle of 0°: a relationship between the inclination angle of the main surface of the silicon substrate and the crystallinity of the silicon substrate. FIG. 3B is a schematic view for describing the following in the case of a silicon substrate inclined slightly relative to a Si (111) plane of the substrate: a relationship between the inclination angle of the main surface of the silicon substrate and the crystallinity of the silicon substrate.

As illustrated in FIG. 3A, in the just substrate in which the inclination angle of the main surface of the silicon substrate is 0°, no atomic steps are in principle present so that an AlN layer formed on the silicon substrate would be based on island growth. As described above, a large lattice constant difference exists between Si and AlN, so that in AlN bonded onto Si, the lattice constant difference would be relieved by inclining an AlN <0001> axis of AlN slightly to an Si <111> axis of Si. AlN is bonded to silicon atoms on silicon atoms arranged flatly, so that the inclined direction of the AlN <0001> axis becomes random. As a result, as illustrated in FIG. 3A, the X-ray full width half maximum to an AlN <0002> axis of the AlN film formed on AlN on the just substrate becomes large.

By contrast, as illustrated in FIG. 3B, atomic steps are present in a surface of a silicon substrate that is slightly inclined from a Si (111) plane of the substrate. From the atomic steps as starting points, crystals of AlN would grow. When Al atoms and N atoms are adsorbed onto the Si substrate and the adsorption is applied to atomic terraces of the substrate, the atoms are fixed only in an in-plane perpendicular direction thereof. However, in the atomic steps, Si atoms are present at least in the in-plane perpendicular direction and the horizontal direction, so that the AlN <0001> axis is fixed in two or more axes. As illustrated in FIG. 3B, therefore, the full X-ray width half maximum to the rocking curve of the AlN (0002) would become small. At this time, a large difference in lattice constant exists between Si and AlN, so that the AlN <0001> axis is inclined relative to the Si <111> axis. Since the AlN <0001> axis is inclined relative to the Si <111> axis in this way, a difference in lattice constant would be relieved between the silicon substrate and AlN so that phase dislocations would be decreased. Moreover, when the inclination angle of the silicon substrate becomes large, a large step-bunching is generated. The bunching would deteriorate the crystallinity of AlN produced on the silicon substrate.

Figure 4:
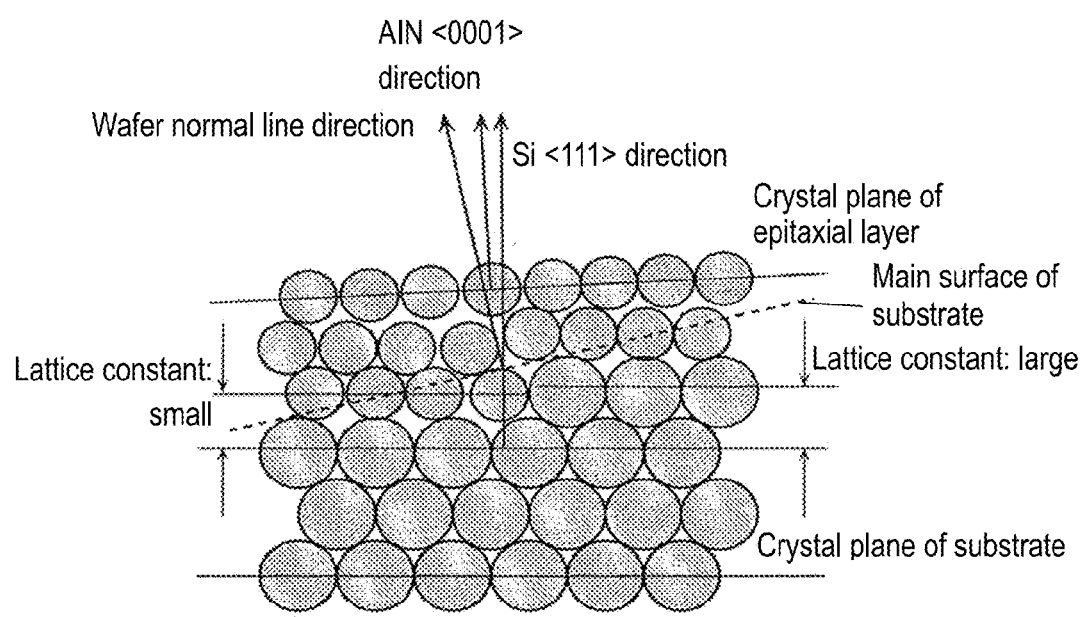
FIG. 4 is a schematic sectional view of growing crystals concerned with the present invention.

Specifically, as illustrated in FIG. 4, in steps on a silicon substrate, AlN would grow to cause its AlN <0001> axis to be inclined relative to a Si <111> axis of the substrate. From this matter, crystals of a GaN layer would grow to assume crystal information of the AlN layer.

Figure 5A:
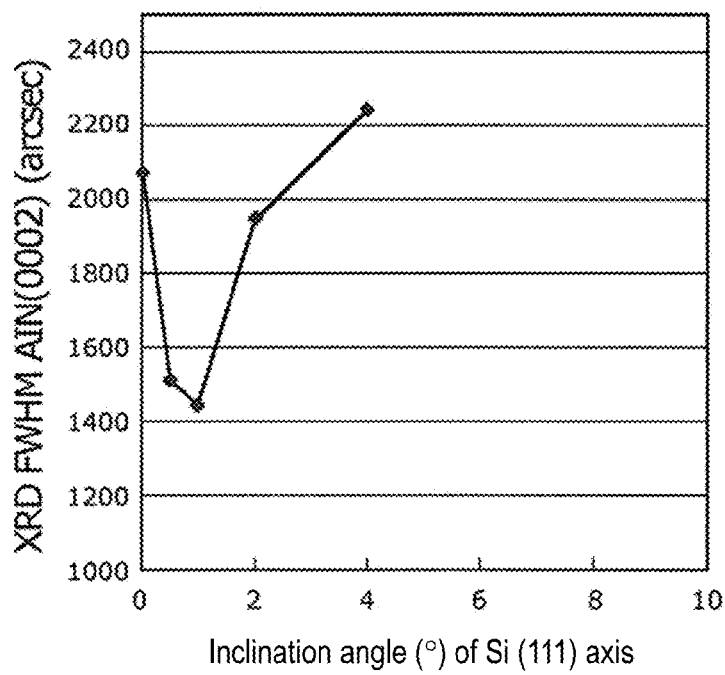
FIG. 5A is a graph showing the crystallinity of an aluminum nitride layer formed on a silicon substrate having a main surface inclined in a Si (10-1) direction of the substrate from a Si (111) plane of the substrate.
Figure 5B:
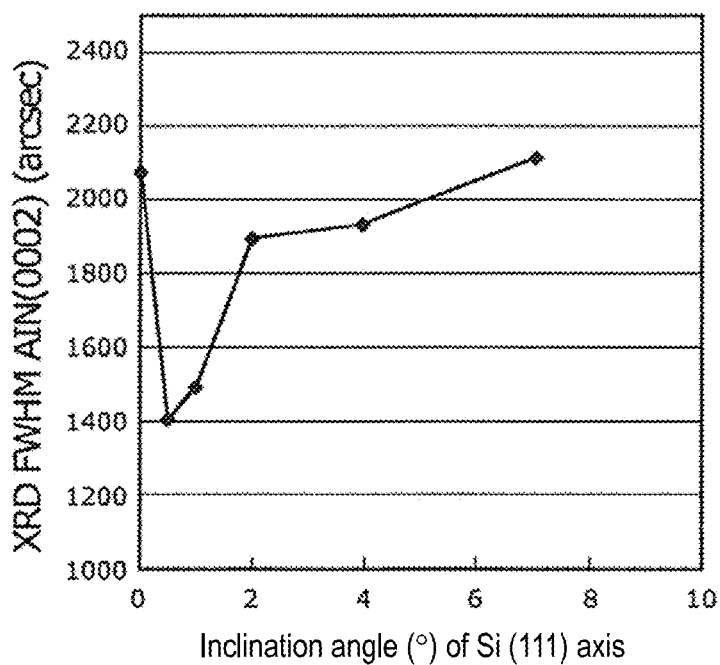
FIG. 5B is a graph showing the crystallinity of an aluminum nitride layer formed on a silicon substrate having a main surface inclined in a Si (1-12) direction of the substrate from a Si (111) plane of the substrate.

Next, in each of FIGS. 5A and 5B, the full width half maximum of a rocking curve of AlN (0002) according to XRD is shown. According to FIG. 5A, it is understood that in the Si (10-1) direction, the value of the rocking curve is small when the slight inclination angle is more than 0° and about 2° or less, and thus the nitride semiconductor device 100 samples each formed on silicon substrate 101 inclined in the Si (10-1) direction are each better in crystallinity than the nitride semiconductor device sample formed on silicon substrate 101 uninclined, which is a just substrate (the inclination angle thereof is 0°). Similarly, according to FIG. 5B, in the Si (-1-12) direction, the rocking curve value is small when the slight inclination angle is more than 0° and about 4° or less. It is therefore understood that the nitride semiconductor device 100 samples each formed on silicon substrate 101 inclined in the Si (-1-12) direction are each better in crystallinity than the nitride semiconductor device 100 sample formed on uninclined silicon substrate 101. By contrast, the nitride semiconductor device samples each formed on the silicon substrate the inclination angle of which is larger than 4° are each larger in rocking curve value than the nitride semiconductor device sample formed on the just substrate (the inclination angle thereof is 0°). It is therefore understood that each of the inclined substrates becomes poorer in crystallinity than the just substrate.

From these results, it can be verified that when a normal line vector of a main surface of a silicon substrate is inclined by an angle larger than 0° and 2° or less regardless of the direction of the vector from a Si (111) plane of the silicon substrate, a nitride semiconductor formed on the silicon substrate is improved in crystallinity.

Figure 6:
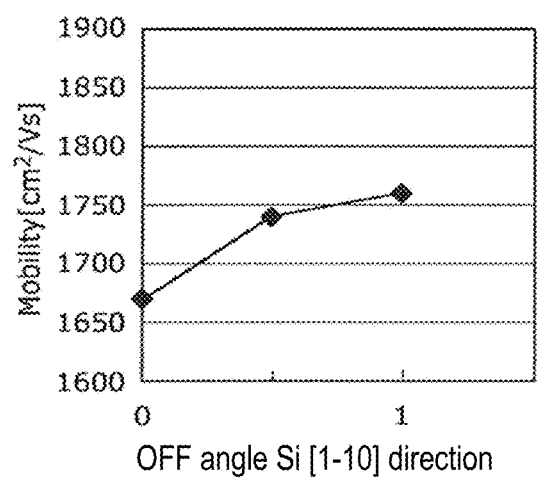
FIG. 6 is a graph showing a relationship between the mobility of electrons in the nitride semiconductor device according to the first exemplary embodiment and the inclination angle between a normal line vector of a main surface of a silicon substrate of the device and a Si <111> axis of the silicon substrate.

Next, about individual samples, a relationship is shown in FIG. 6 between respective electron mobilities of nitride semiconductors of the samples, the mobilities being measured by hole measurement.

From this graph, it is understood that the inclination angle of their Si <111> axis is improved up to 1°. An attempt has been made about a similar sample having an inclination angle of 4°. However, its surface has been cracked so that no hole measurement has been made. From this result, therefore, it can be verified that when a main surface of a silicon substrate is inclined by an angle larger than 0° and smaller than 1°, the mobility in a nitride semiconductor thereon rises.

As described above, according to the present exemplary embodiment, when a silicon substrate is made different in crystal axial direction from a nitride semiconductor layer formed on the silicon substrate, the nitride semiconductor layer formed on the silicon substrate can be improved in crystallinity. This exemplary embodiment makes it possible to improve a field effect transistor having a nitride semiconductor in electron mobility to realize a decrease in on-resistance of the field effect transistor.

Second Exemplary Embodiment

The following will describe a nitride semiconductor substrate according to a second exemplary embodiment of the present invention.

In the present exemplary embodiment, a description is made about a nitride semiconductor substrate including a silicon substrate and a nitride semiconductor layer formed on the silicon substrate.

Figure 7:
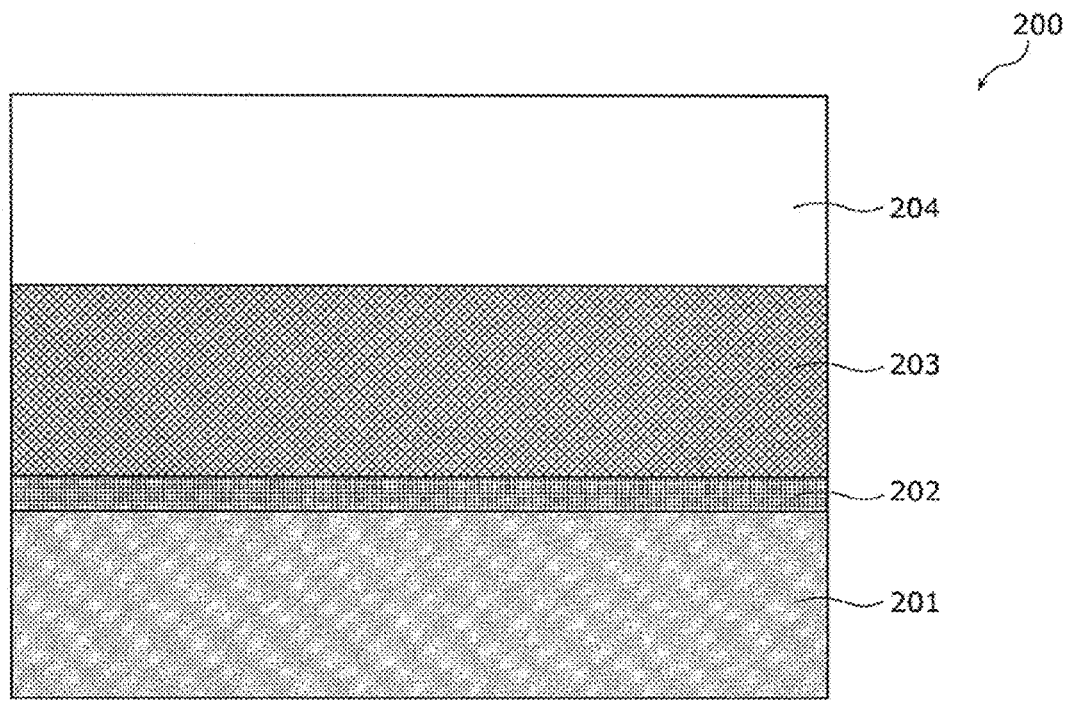
FIG. 7 is a schematic sectional view illustrating a structure of a nitride semiconductor substrate according to a second exemplary embodiment.
Figure 8A:
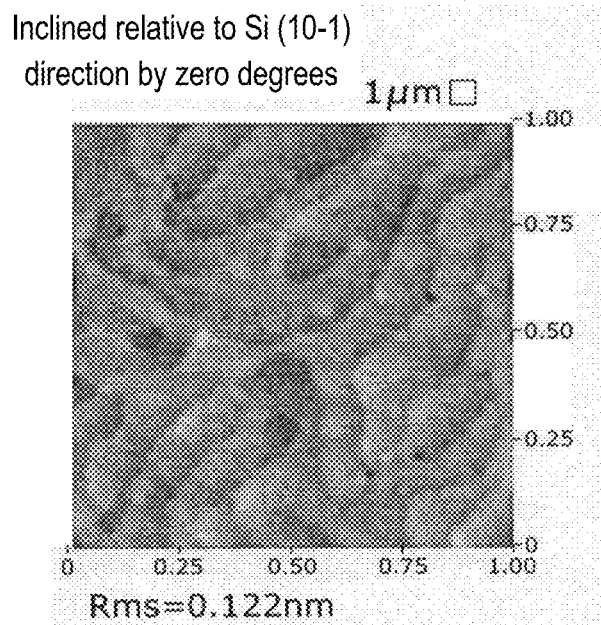
FIG. 8A shows a surface AFM image of a gallium nitride layer when the following angle is 0°: the angle between a normal line vector of a silicon substrate and a Si <111> axis of the substrate relative to a Si (1-10) direction of the substrate.
Figure 8B:
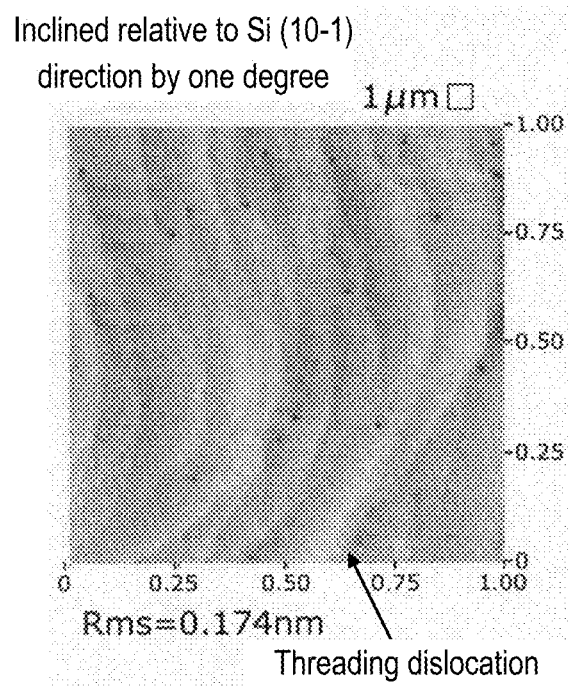
FIG. 8B shows a surface AFM image of a gallium nitride layer when the following angle is 1°: the angle between a normal line vector of a silicon substrate and a Si <111> axis of the substrate relative to a Si (1-10) direction of the substrate.
Figure 8C:
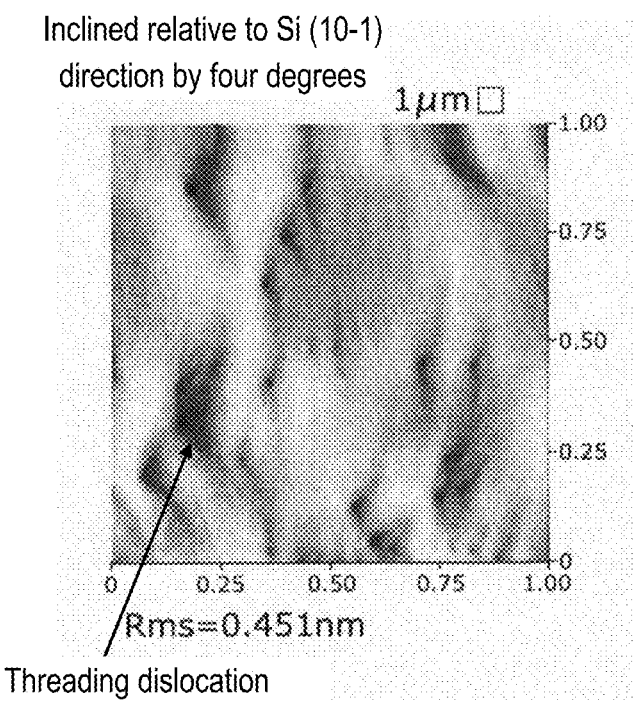
FIG. 8C shows a surface AFM image of a gallium nitride layer when the following angle is 4°: the angle between a normal line vector of a silicon substrate and a Si <111> axis of the substrate relative to a Si (1-10) direction of the substrate.
Figure 8D:
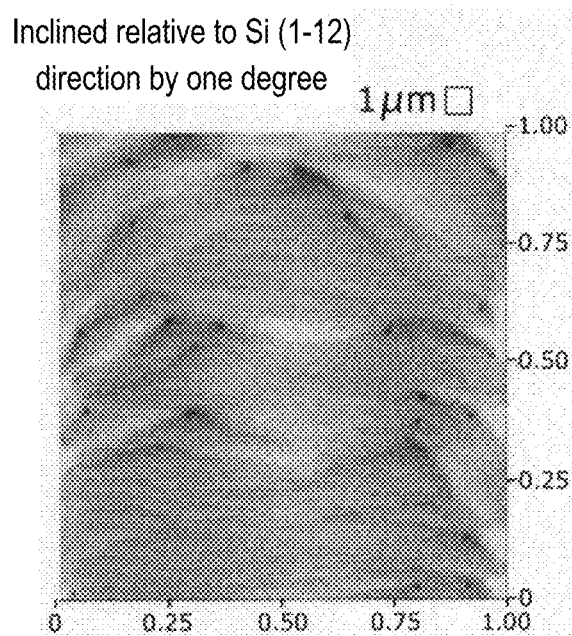
FIG. 8D shows a surface AFM image of a gallium nitride layer when the following angle is 1°: the angle between a normal line vector of a silicon substrate and a Si <111> axis of the substrate relative to a Si (1-10) direction of the substrate.

FIG. 7 is a schematic view illustrating a structure of the nitride semiconductor substrate according to the present exemplary embodiment.

As illustrated in FIG. 7, this substrate, which is nitride semiconductor substrate 200, has silicon substrate 201 having a main surface inclined slightly from a Si <111> plane of silicon substrate 201, first nitride semiconductor layer 202 formed on silicon substrate 201 and made of aluminum nitride, fourth nitride semiconductor layer 203 formed on first nitride semiconductor layer 202 and made of AlGaN, and second nitride semiconductor layer 204 formed on fourth nitride semiconductor layer 203 and made of GaN.

The structure illustrated in FIG. 7 has been formed on each of plural silicon substrate 201 samples different from one another in crystal axis inclination: Four silicon substrate samples have been prepared as the silicone substrate 201 samples, the samples being a silicon substrate sample in which the inclination angle of its Si (1-10) direction is 0° to its Si (111) plane (Si (111) just substrate), a silicon substrate sample inclined by 1.0° in its Si (1-10) direction from its Si (111) plane, a silicon substrate sample inclined by 4.0° in its Si (1-10) direction from its Si (111) plane, and a silicon substrate sample inclined by 1.0° in its Si (1-12) direction from its Si (111) plane. The nitride semiconductor layers have then been formed on each of these silicon substrate samples. Surface AFM images of these nitride semiconductor substrate samples are shown in FIGS. 8A to 8D, respectively.

According to FIGS. 8A to 8D, it is understood that in a gallium nitride (GaN) layer on the Si (111) just substrate, atomic steps are random so that the layer grows in an island form.

The following are understood: compared to the GaN layer formed on the just substrate, in the GaN layer formed on the silicon substrate inclined by 1.0° from the Si (111) plane of the substrate in the Si (1-10) direction thereof, respective directions of atomic steps are consistent with one another in a GaN (1-100) direction or GaN (11-20) direction of this GaN layer; and the layer experiences step flow growth, that is, the layer grows to be inclined, at step regions on the silicon substrate, in a GaN <1-100> axial direction or GaN <11-20> axial direction of the layer from a Si <111> axis of the substrate.

Similarly, it is understood that in the GaN layer formed on the substrate inclined by 1.0° from the Si (111) plane of the substrate in the Si (1-12) direction thereof, respective directions of atomic steps are consistent with one another, and the layer experiences step flow growth.

In the GaN layer formed on the substrate inclined by 4.0° from the Si (111) plane of the substrate in the Si (1-10) direction thereof, a large step bunching is generated at a threading dislocation portion of the layer. When the inclination angle becomes large, a step bunching is generated so that defects such as a stacking fault are easily generated. Moreover, the flatness of the front surface of the nitride semiconductor GaN substrate would be damaged. The film thickness of the AlGaN layer formed on the GaN layer, the flatness of which is damaged in this way, is varied to have a distribution, so that the 4.0°-inclination sample in FIG. 8C would be cracked.

When FIGS. 2A and 2B are considered from these observed results, the following are presumed: when the normal line vector of silicon substrate 201 is inclined at an angle in the range more than 0° and less than 2.0° relative to the Si <111> axis, the nitride semiconductor substrate formed on silicon substrate 201 is improved in crystallinity; and with an inclination of 2.0° or more, the flatness of the front surface of the nitride semiconductor substrate is damaged so that the substrate is lowered in crystallinity.

Figure 9A:
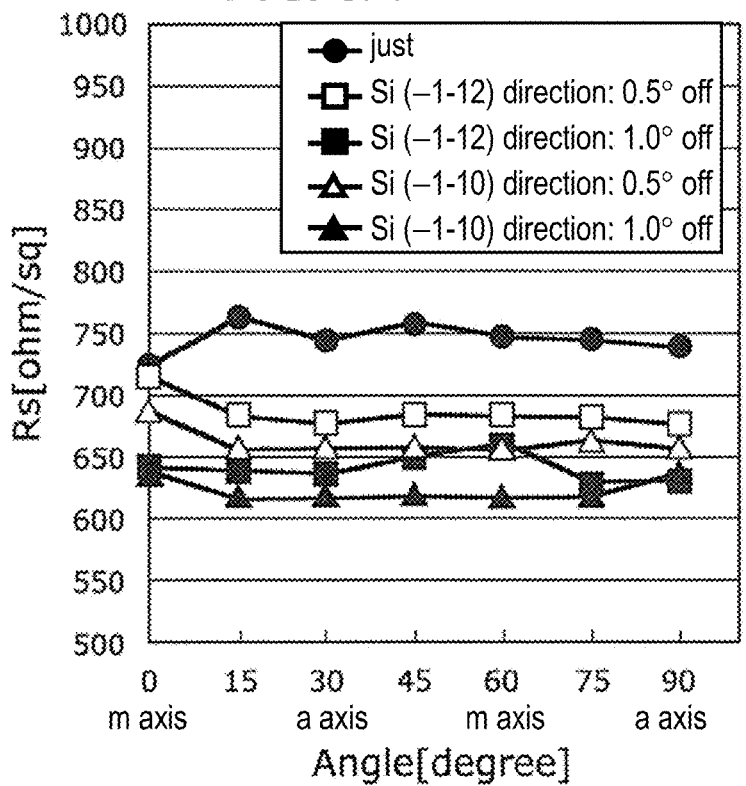
FIG. 9A is a graph showing an in-plane anisotropy of the sheet resistance of a nitride semiconductor device relative to the inclination angle between a normal line vector of a main surface of a silicon substrate of the device, and a Si <111> axis of the silicon substrate.
Figure 9B:
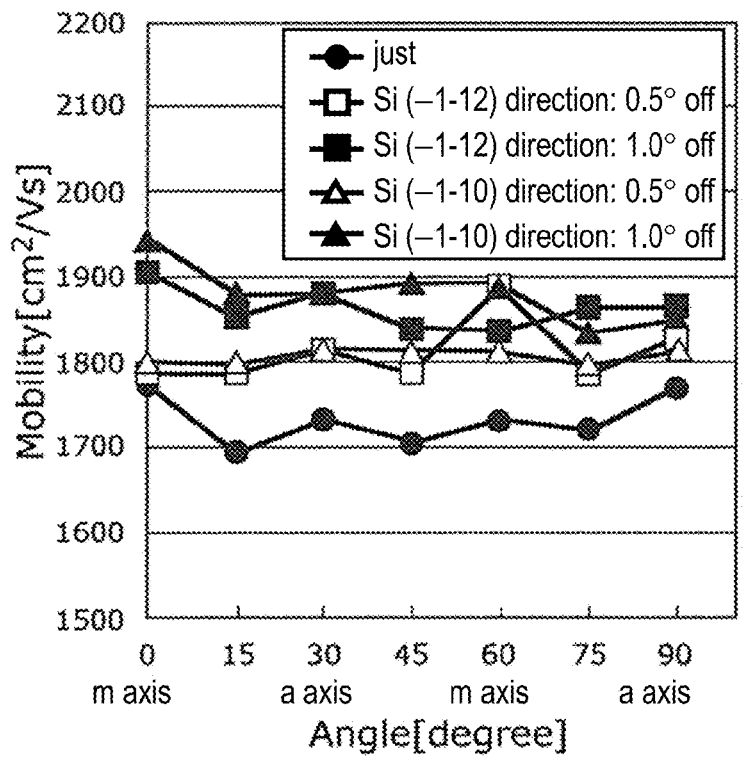
FIG. 9B is a graph showing an in-plane anisotropy of the mobility of electrons relative to the inclination angle between a normal line vector of a main surface of a silicon substrate, and a Si <111> axis of the silicon substrate.

Apart from the above, FIG. 9A is a graph showing an in-plane anisotropy of the sheet resistance of a nitride semiconductor device relative to the inclination angle between a normal line vector of a main surface of a silicon substrate of the device, and a Si <111> axis of the silicon substrate. FIG. 9B is a graph showing an in-plane anisotropy of the mobility of electrons relative to the inclination angle between a normal line vector of a main surface of a silicon substrate, and a Si <111> axis of the silicon substrate.

According to FIG. 9A, a nitride semiconductor substrate sample formed on a silicon substrate in which a Si (1-10) direction has an inclination angle of 1.0° has a minimum sheet resistance. According to FIG. 9B, the nitride semiconductor substrate sample, which is formed on the silicon substrate in which the Si (1-10) direction has the inclination angle of 1.0°, has a maximum electron mobility. Accordingly, when a silicon substrate is slightly inclined differently from a just substrate, the inclined substrate can be lowered in sheet resistance and be further improved in electron mobility.

It is not observed that the sheet resistance depends on the in-plane direction. However, it is understood that the mobility is improved when the mobility-observed direction is consistent with a (1-100) direction or a (11-20) direction of the nitride semiconductor. This is based on the following: as shown in the AFM images in FIGS. 8A to 8D, the direction of atomic steps in the nitride semiconductor (GaN) layer is close to the (1-100) direction or the (11-20) direction. In other words, in the case of an HFET structure, it appears that: when its (11-20) direction or (1-100) direction is an electron-moving direction, there is a high possibility that its 2DEG portion overlaps with its flat portion corresponding to atomic terraces of the nitride semiconductor layer; thus, the electron mobility is improved. In light of this matter, when the electron-moving direction is made parallel to a <11-20> axis or <1-100> axis of the nitride semiconductor layer, nitride semiconductor substrate 200 is improved in electron mobility, so that the nitride semiconductor device can realize high-speed operations.

Figure 10A:
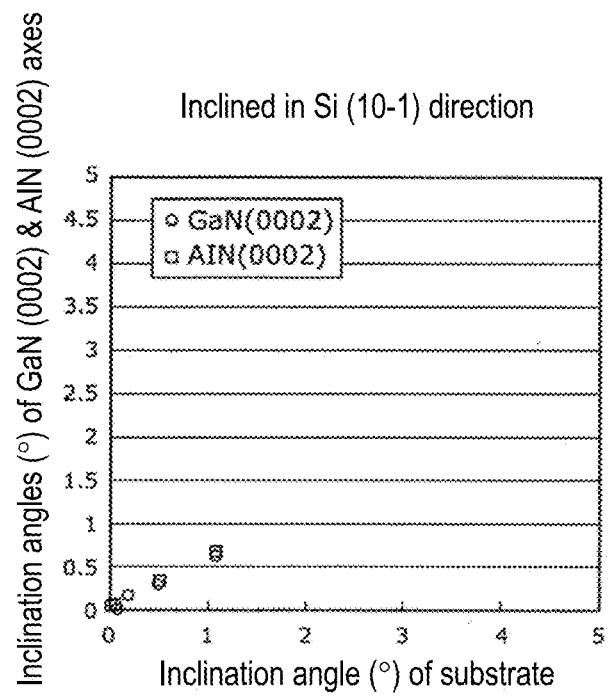
FIG. 10A is a graph showing a relationship between the inclination angle of its Si <111> axis of a silicon substrate that is inclined from a main surface of a nitride semiconductor layer toward a Si (10-1) direction of the silicon substrate, and the inclination angle of its AlN <0002> axis and that of its GaN <0002> axis.

FIG. 10A is a graph showing a relationship between the inclination angle of a Si <111> axis of a silicon substrate that is inclined from a main surface of a nitride semiconductor layer in a Si (10-1) direction of the silicon substrate, and the inclination angle of an AlN <0002> axis of an AlN layer constituting the nitride semiconductor layer and that of a GaN <0002> axis of a GaN layer formed on the AlN layer. According to FIG. 10A, the Si <111> axis and the AlN <0002> axis are deviated between each other. For example, when the inclination angle of the Si <111> axis is 1° relative to the main surface of the nitride semiconductor layer, the inclination angle of the AlN <0002> axis is about 0.7°.

From this matter, according to the use of a slightly inclined Si substrate, at the time of forming an AlN layer thereon, crystals of AlN would grow to relieve a large lattice constant difference between Si and AlN. Specifically, as in the schematic view of FIG. 4, the AlN crystals would grow in such a manner that the AlN <0002> axis is inclined relative to the Si <111> axis.

Figure 10B:
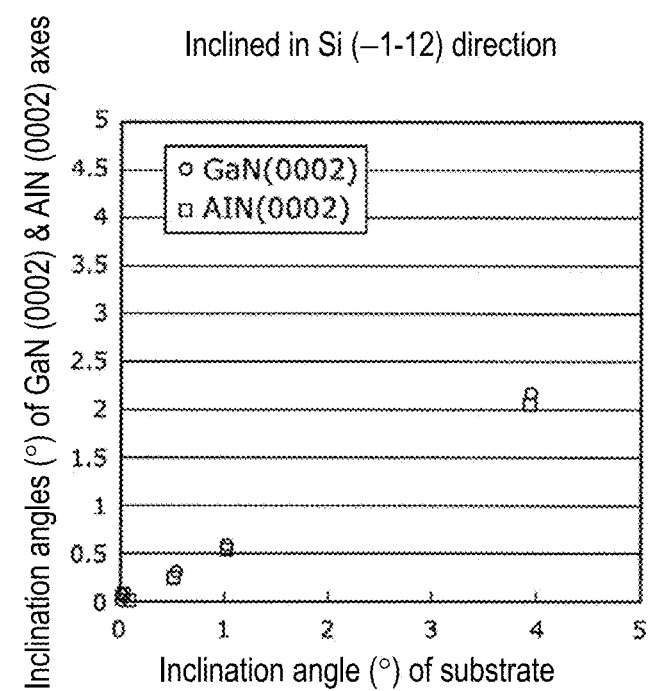
FIG. 10B is a graph showing a relationship between the inclination angle of its Si <111> axis of a silicon substrate that is inclined from a main surface of a nitride semiconductor layer toward a Si (-1-12) direction of the silicon substrate, and the inclination angle of its AlN <0002> axis and that of its GaN <0002> axis.

FIG. 10B is a graph showing a relationship between the inclination angle of a Si <111> axis of a silicon substrate that is inclined from a main surface of a nitride semiconductor layer in a Si (-1-12) direction of the silicon substrate, and the inclination angle of an AlN <0002> axis of an AlN layer constituting the nitride semiconductor layer and that of a GaN <0002> axis formed on the AlN layer. As illustrated in FIG. 10B, also in the case of forming the nitride semiconductor layer on the slightly inclined Si substrate inclined from the main surface of the nitride semiconductor layer in the Si (-1-12) direction, similar results are obtained.

According to FIGS. 10A and 10B, it is understood that the AlN <0002> axis and the GaN <0002> axis have substantially the same inclination angle, and these crystal axes are substantially equal to each other in direction. From this matter, about the GaN layer, crystals thereof would grow on the AlN layer to assume crystal information of the AlN layer.

As described above, according to the present exemplary embodiment, by atomic steps present on a slightly inclined Si (111) substrate, an AlN layer is formed in such a manner that a Si <111> axis of the substrate and an AlN <0001> axis of this AlN layer are deviated between each other. By the AlN formation, the AlN layer can be formed with good crystallinity. An HFET structure formed thereon can be improved in electron mobility. This exemplary embodiment makes it possible to provide a nitride semiconductor substrate capable of realizing a decrease in on-resistance of a field effect transistor.

In the above-mentioned exemplary embodiments, the description has been made about nitride semiconductor substrates each related to a structure to be applied to a field effect transistor (FET). However, the above-mentioned nitride semiconductor substrates are each applicable to a structure related to any other transistor, diode (rectifier), or light emitting diode (LED).

Other Exemplary Embodiments

The present invention has been described by way of the exemplary embodiments. However, the present invention is not limited by the exemplary embodiments.

For example, the nitride semiconductor device may have a structure which does not have any fourth nitride semiconductor layer as a buffer layer. The ratio among composition elements in $In_xAl_yGa_{1-x-y}N$ of each of the second and third nitride semiconductor layers is not limited to the above-mentioned examples, and may be appropriately changed.

The present invention is applicable to various alternative exemplary embodiments, working examples, and operation techniques as far as the resultants are within the scope of the subject matters recited in the claims.

INDUSTRIAL APPLICABILITY

The nitride semiconductor device and the nitride semiconductor substrate according to the present invention are useful for, for example, field effect transistors such as HFETs and HEMTs for which high-speed operation and high-efficiency operation are required.

REFERENCE MARKS IN THE DRAWINGS

100: nitride semiconductor device
101, 201: silicon substrate
102, 202: first nitride semiconductor layer
103, 203: fourth nitride semiconductor layer
104, 204: second nitride semiconductor layer
105: third nitride semiconductor layer
106: source electrode (first electrode)
107: gate electrode (third electrode)
108: drain electrode (second electrode)
109: two-dimensional electron gas
200: nitride semiconductor substrate

The invention claimed is:

1. A nitride semiconductor device, comprising:
a silicon substrate; and
a first nitride semiconductor layer formed over the silicon substrate, and comprising a nitride semiconductor,
wherein a first electrode and a second electrode disposed on an upper side of the first nitride semiconductor layer, and
wherein a Si <111> axial direction of the silicon substrate is not in parallel with a <0001> axial direction of the first nitride semiconductor layer.

2. The nitride semiconductor device according to claim 1, wherein an angle included between a normal line vector direction of a main surface of the first nitride semiconductor layer and the <0001> axial direction of the first nitride semiconductor layer is smaller than an angle included between a normal line vector direction of a main surface of the silicon substrate and the Si <111> axial direction of the silicon substrate.

3. The nitride semiconductor device according to claim 1, further comprising a second nitride semiconductor layer over the first nitride semiconductor layer,
wherein the <0001> axial direction of the first nitride semiconductor layer is parallel to a <0001> axial direction of the second nitride semiconductor layer.

4. The nitride semiconductor device according to claim 3, further comprising a third nitride semiconductor layer over the second nitride semiconductor layer,
wherein an average band gap of the third nitride semiconductor layer is larger than an average band gap of the second nitride semiconductor layer.

5. The nitride semiconductor device according to claim 4, wherein the first electrode and the second electrode are disposed over the third nitride semiconductor layer, and
wherein longitudinal directions of the first electrode and the second electrode are parallel to a <11-20> axial direction of the second nitride semiconductor layer.

6. The nitride semiconductor device according to claim 4, wherein the first electrode and the second electrode are formed over the third nitride semiconductor layer, and
longitudinal directions of the first electrode and the second electrode are parallel to a <1-100> axis of the second nitride semiconductor layer.

7. The nitride semiconductor device according to claim 1, wherein the first nitride semiconductor layer comprises aluminum.

8. The nitride semiconductor device according to claim 1, wherein the normal line vector direction of the main surface of the silicon substrate is inclined relative to the Si <111> axial direction at an angle larger than 0° and smaller than 2.0°.

9. The nitride semiconductor device according to claim 4, further comprising a fourth nitride semiconductor layer between the first nitride semiconductor layer and the second nitride semiconductor layer,
wherein an average band gap of the fourth nitride semiconductor layer is larger than the average band gap of the second nitride semiconductor layer.

10. A nitride semiconductor substrate, comprising:
a silicon substrate; and
a first nitride semiconductor layer formed over the silicon substrate, and comprising a nitride semiconductor,
wherein a Si <111> axial direction of the silicon substrate is not in parallel with a <0001> axial direction of the first nitride semiconductor layer.

11. The nitride semiconductor substrate according to claim 10,
wherein an angle included between a normal line vector direction of a main surface of the first nitride semiconductor layer and the <0001> axial direction of the first nitride semiconductor layer is smaller than an angle included between a normal line vector direction of a main surface of the silicon substrate and the Si <111> axial direction.

12. The nitride semiconductor substrate according to claim 10, further comprising a second nitride semiconductor layer over the first nitride semiconductor layer,
wherein the <0001> axial direction of the first nitride semiconductor layer is parallel to a <0001> axial direction of the second nitride semiconductor layer.

13. The nitride semiconductor substrate according to claim 12, further comprising a third nitride semiconductor layer over the second nitride semiconductor layer,
wherein an average band gap of the third nitride semiconductor layer is than an average band gap of the second nitride semiconductor layer.

14. The nitride semiconductor substrate according to claim 10, wherein the first nitride semiconductor layer comprises aluminum.

15. The nitride semiconductor substrate according to claim 10, wherein the normal line vector direction of the main surface of the silicon substrate is inclined relative to the Si <111> axial direction at an angle larger than 0° and smaller than 2.0°.

16. The nitride semiconductor substrate according to claim 13, further comprising a fourth nitride semiconductor layer between the first nitride semiconductor layer and the second nitride semiconductor layer,
wherein an average band gap of the fourth nitride semiconductor layer is larger than the average band gap of the second nitride semiconductor layer.

* * * * *